(12) United States Patent
Kuwahara et al.

(10) Patent No.: US 7,956,918 B2
(45) Date of Patent: Jun. 7, 2011

(54) SOLID-STATE IMAGE PICKUP DEVICE HAVING IMPROVED LIGHT SHIELDING CHARACTERISTICS AND CAMERA INCLUDING THE SAME

(75) Inventors: Takashi Kuwahara, Osaka (JP); Yasuyuki Shimizu, Kyoto (JP)

(73) Assignee: Panasonic Corporation, Osaka (JP)

( * ) Notice: Subject to any disclaimer, the term of this patent is extended or adjusted under 35 U.S.C. 154(b) by 1224 days.

(21) Appl. No.: 11/606,185

(22) Filed: Nov. 30, 2006

(65) Prior Publication Data

US 2007/0126906 A1    Jun. 7, 2007

(30) Foreign Application Priority Data

Dec. 1, 2005  (JP) .................. 2005-347639

(51) Int. Cl.
    *H04N 5/335*    (2011.01)
(52) U.S. Cl. ....................................................... 348/311
(58) Field of Classification Search .................. 348/308, 348/311
    See application file for complete search history.

(56) References Cited

U.S. PATENT DOCUMENTS

| | | | | |
|---|---|---|---|---|
| 5,442,396 A | * | 8/1995 | Nakashiba | 348/322 |
| 5,705,837 A | * | 1/1998 | Tanigawa et al. | 257/223 |
| 5,894,143 A | * | 4/1999 | Tanigawa et al. | 257/236 |
| 6,541,805 B1 | * | 4/2003 | Suzuki | 257/232 |
| 7,084,443 B2 | * | 8/2006 | Kitano et al. | 257/291 |
| 7,701,498 B2 | * | 4/2010 | Imamura et al. | 348/305 |
| 2003/0002094 A1 | * | 1/2003 | Suzuki | 358/513 |
| 2006/0022235 A1 | * | 2/2006 | Kanbe | 257/294 |
| 2009/0213247 A1 | * | 8/2009 | Tanaka et al. | 348/240.99 |

FOREIGN PATENT DOCUMENTS

| | | |
|---|---|---|
| JP | 2004-180284 A | 6/2004 |
| JP | 2005-166826 A | 6/2005 |

* cited by examiner

*Primary Examiner* — Lin Ye
*Assistant Examiner* — Amy Hsu
(74) *Attorney, Agent, or Firm* — McDermott Will & Emery LLP

(57) ABSTRACT

Provided is a solid-state image pickup device capable of outputting fine quality image signals at high speed. Vertical transfer sections 40 and a distribution transfer section 20 have a common pattern of electrodes for each 2n+1 (n is an integer equal to or greater than 1) and comprise driving electrodes V1 to V6, V3R, V3L, V5R, and V5L, to which driving pulses $\phi$V1 to $\phi$V6, $\phi$V3R, $\phi$V3L, $\phi$V5R, and $\phi$V5L are applied. The driving electrodes V1, V2, V4, and V6 are shared by all columns and the driving electrodes V3, V3R, V3L, V5R, and V5L are independent electrodes which are separated in an island-like manner. The distribution transfer section 20 controls, independently for each column, reading out signal charges from the vertical transfer sections 40 to the horizontal transfer section 10.

10 Claims, 7 Drawing Sheets

SOLID-STATE IMAGE PICKUP DEVICE HAVING IMPROVED LIGHT SHIELDING CHARACTERISTICS AND CAMERA INCLUDING THE SAME

BACKGROUND OF THE INVENTION

1. Field of the Invention

The present invention relates to a solid-state image pickup device using a charge-coupled device.

2. Description of the Background Art

It has been required for a solid-state image pickup device mounted in a digital still camera or the like to address a demand for a reduction in size and weight, high reliability, high sensitivity, a high dynamic range, and further high resolution.

A conventional solid-state image pickup device disclosed in Japanese Laid-Open Patent Publications No. 2004-180284 and No. 2005-166826 will be described.

FIGS. 7A and 7B are diagrams illustrating the conventional solid-state image pickup device. More particularly, FIG. 7A is a schematic configuration diagram and FIG. 7B is a configuration diagram illustrating an arrangement of gates in a distribution transfer section 20 having a plurality of driving electrodes, which are provided independently in a column direction, for controlling readout of signal charges from an image pickup region 30 to a horizontal transfer section 10. FIG. 8 is a schematic diagram illustrating wiring in the distribution transfer section.

In FIG. 7A, the conventional solid-state image pickup device comprises a plurality of photo-detecting sections 50 which are disposed in a two-dimensional manner corresponding to pixels and in each of which any of filters of three colors such as red (R), green (G), and blue (B) is provided; and a CCD (Charge-Coupled Device) including driving electrodes V1 to V6, V3R, V3L, V5R, and V5L.

The conventional solid-state image pickup device further comprises a plurality of vertical transfer sections 40 for transferring in a vertical direction signal charges which are generated by the photo-detecting sections 50 in accordance with application of driving pulses $\phi$V1 to $\phi$V6, $\phi$V3R, $\phi$V3L, $\phi$V5R, and $\phi$V5L and driving electrodes H1 and H2.

The conventional solid-state image pickup device further comprises a horizontal transfer section 10 for transferring signal charges in a horizontal direction to an output amplifier 60 in accordance with driving pulses $\phi$H1 and $\phi$H2; and a distribution transfer section 20 which is disposed between the horizontal transfer section 10 and the image pickup region 30 having the plurality of photo-detecting sections 50 and the plurality of vertical transfer sections 40 disposed therein. The distribution transfer section 20 includes a plurality of driving electrodes, which are disposed independently in a column direction, for controlling readout of the signal charges from the image pickup region 30 to the horizontal transfer section 10.

In FIG. 7B, the vertical transfer sections 40 and the distribution transfer section 20 have a common pattern of electrodes for each 2n+1 (n is an integer equal to or greater than 1) columns and comprise driving electrodes V1 to V6, V3R, V3L, V5R, and V5L to which driving pulses $\phi$V1 to $\phi$V6, $\phi$V3R, $\phi$V3L, $\phi$V5R, and $\phi$V5L are applied.

The driving electrodes V1, V2, V4, and V6 are shared by all columns and the driving electrodes V3, V3R, V3L, V5R, and V5L are independent electrodes which are separated in an island-like manner for each column. The distribution transfer section 20 controls, independently for each column, readout of the signal charges from the vertical transfer sections 40 to the horizontal transfer section 10.

In FIG. 8, driving pulses are inputted via independent wires 110 to driving electrodes V3, V3R, V3L, V5, V5R, and V5L in the distribution transfer section 20.

In this case, in order to supply the driving pulses to the distribution transfer section 20, a total of six independent wires 110 are required for the independent electrodes V3, V3R, V3L, V5, V5R, and V5L. Three independent wires 110 extend in a horizontal direction in the image pickup region 30 and are connected to the driving electrodes V3, V3R, and V3L, and the other independent wires cross over the horizontal transfer section 10 and are connected to the driving electrodes V5, V5R, and V5L.

In the conventional solid-state image pickup device, the independent wires connected to the driving electrodes V5, V5R, and V5L are formed in an aluminum layer. In this case, the horizontal transfer section is light-shielded by a tungsten layer, leading to a problem of not obtaining a sufficient light shielding characteristic.

SUMMARY OF THE INVENTION

Given the above-mentioned problem in the conventional solid-state image pickup device, an object of the present invention is to provide a solid-state image pickup device which has a distribution transfer section and in which in order to improve performance of light-shielding a horizontal transfer section, the horizontal transfer section is covered by a metal layer, such as an aluminum layer, having a high light shielding characteristic.

In order to attain the above-mentioned object, a first aspect of the present invention is directed to the solid-state image pickup device comprising: a plurality of photo-detecting sections for generating signal charges; a plurality of vertical transfer sections for transferring the signal charges in a vertical direction; a horizontal transfer section for receiving the signal charges from the vertical transfer sections and transferring the received signal charges in a horizontal direction; a distribution transfer section including a plurality of driving electrodes which are independently provided in a column direction in order to transfer the signal charges from the vertical transfer sections to the horizontal transfer section; and a first wire, which is formed on the horizontal transfer section and connected to the driving electrodes, for light-shielding the horizontal transfer section.

It is preferable that the horizontal transfer section is light-shielded only by the first wire.

It is preferable that the first wire is formed in an aluminum layer.

It is preferable that the solid-state image pickup device further comprises a second light shielding layer formed above the horizontal transfer section.

It is preferable that the solid-state image pickup device further comprises a second light shielding layer formed above the distribution transfer section.

It is preferable that the solid-state image pickup device further comprises second wires formed above the horizontal transfer section.

It is preferable that the second wires are formed in the second light shielding layer which is an aluminum layer.

It is preferable that the distribution transfer section has a common pattern of electrodes for each n (n is an integer equal to or greater than 2) columns.

It is preferable that the solid-state image pickup device further comprises a black on-chip lens layer which is formed in at least one of a region above the distribution transfer section and a region above the horizontal transfer section.

It is preferable that the solid-state image pickup device further comprises a colored on-chip lens layer which is formed in at least one of the region above the distribution transfer section and the region above the horizontal transfer section.

A second aspect of the present invention is directed to a camera including the solid-state image pickup device according to the first aspect.

In the solid-state image pickup device according to the present invention, it is not required to discard signal charges when mixing pixel signals and a gravity center of each of a plurality of pixels which output pixel signals to be mixed in the horizontal transfer section is regular. Therefore, a number of pixels in a horizontal direction can be reduced. Further, the solid-state image pickup device is capable of outputting fine quality image signals at high speed without generating moire and a false signal.

In addition, since all independent wires for the driving electrodes are formed in a horizontal transfer direction in the image pickup region, the horizontal transfer section can be light-shielded by the aluminum layer, attaining more excellent light shielding performance than that of the conventional solid-state image pickup device.

Since the horizontal transfer section can be light-shielded by a metal layer such as the aluminum layer which is located at a higher position than a light shielding layer in the conventional horizontal transfer section, a capacitance between terminals of a polysilicon gate electrode and a light-shielding layer can be reduced, reducing unsharpness of pulses which depends on a time constant of the horizontal transfer section, being capable of driving the horizontal transfer section at high speed and increasing a speed of a data rate of an output signal.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Hereinafter, with reference to figures, a first embodiment of the present invention will be described.

Figure 1A:
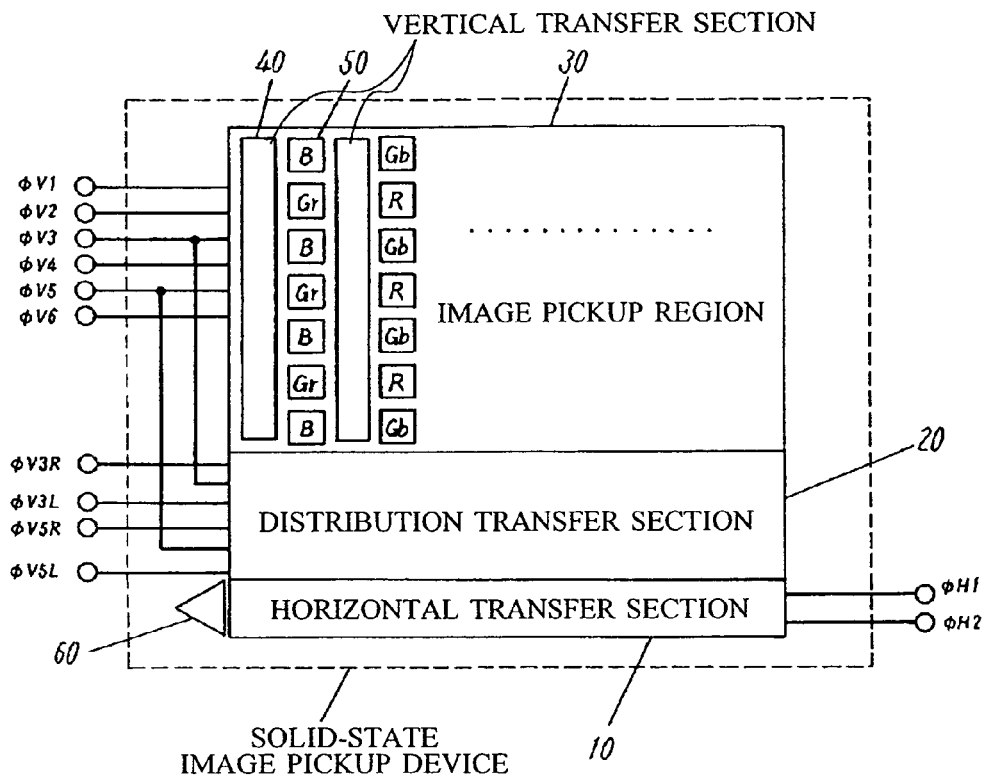
FIG. 1A is a schematic configuration diagram illustrating a solid-state image pickup device according to a first embodiment of the present invention.
Figure 1B:
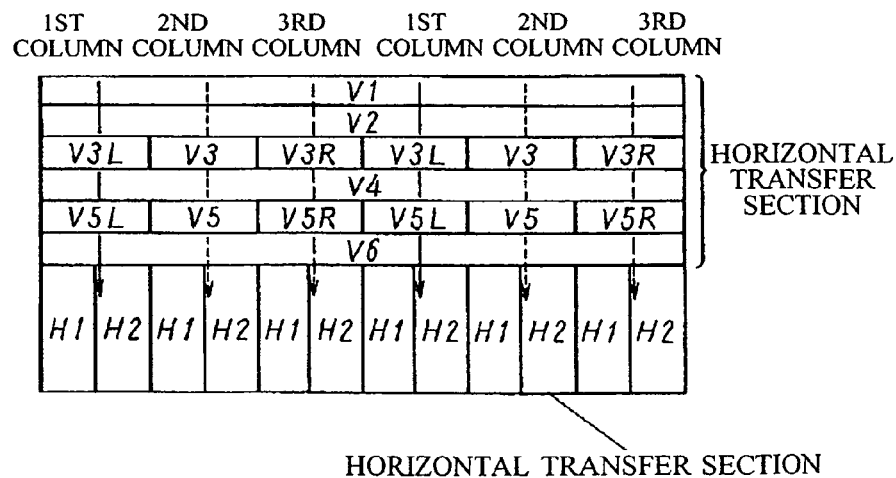
FIG. 1B is a configuration diagram illustrating a gate of a distribution transfer section of the first embodiment.

FIG. 1A is a diagram illustrating a solid-state image pickup device according to the first embodiment of the present invention. FIG. 1B is a diagram illustrating an arrangement of gates in a distribution transfer section.

In FIG. 1A, light entering an image pickup region is photoelectric-converted by a photo-detecting section 50 and a signal charge is generated. The signal charge is read out by a readout transistor or the like (not shown) to a vertical transfer section 40. Thereafter, the signal charge is transferred by the vertical transfer section 40 and reaches a horizontal transfer section 10.

The solid-state image pickup device according to the first embodiment comprises a plurality of photo-detecting sections 50, which are disposed in a two-dimensional manner corresponding to pixels and in each of which any of filters of three colors such as red (R), green (G), and blue (B) is disposed; and driving electrodes V1 to V6, V3R, V3L, V5R, and V5L.

And the solid-state image pickup device comprises a plurality of vertical transfer sections 40, which transfer signal charges generated by the photo-detecting sections 50 in a vertical direction in accordance with application of driving pulses φV1 to φV6, φV3R, φV3L φV5R, and φV5L; horizontal transfer section including driving electrodes H1 and H2.

The solid-state image pickup device according to the first embodiment further comprises a distribution transfer section 20 which includes the horizontal transfer section 10 for transferring the signal charges in a horizontal direction in accordance with application of the driving pulses φH1 and φH2, and independent electrodes, which are disposed independently in a column direction, for controlling reading out the signal charges from the plurality of photo-detecting sections 50 and the plurality of vertical transfer sections 40.

In FIGS. 1A and FIG. 1B, the vertical transfer sections 40 and the distribution transfer section 20 have a common pattern of electrodes for each 2n+1 (n is an integer equal to or greater than 1) columns and comprise the driving electrodes V1 to V6, V3R, V3L, V5R, and V5L to which the driving pulses φV1 to φV6, φV3R, φV3L φV5R, and φV5L are applied.

The driving electrodes V1, V2, V4, and V6 are shared by all columns and the driving electrodes V3, V3R, V3L, V5, V5R, and V5L are separated in an island-like manner for each column. The distribution transfer section 20 controls, independently for each column, reading out the signal charges from the vertical transfer sections 40 to the horizontal transfer section 10.

According to the first embodiment of the present invention, by adopting the above-described configuration, the solid-state image pickup device in which a number of pixels in a horizontal direction is reduced and which is capable of outputting image signals with fine quality and at high speed without causing moire and a false signal can be realized.

Figure 2:
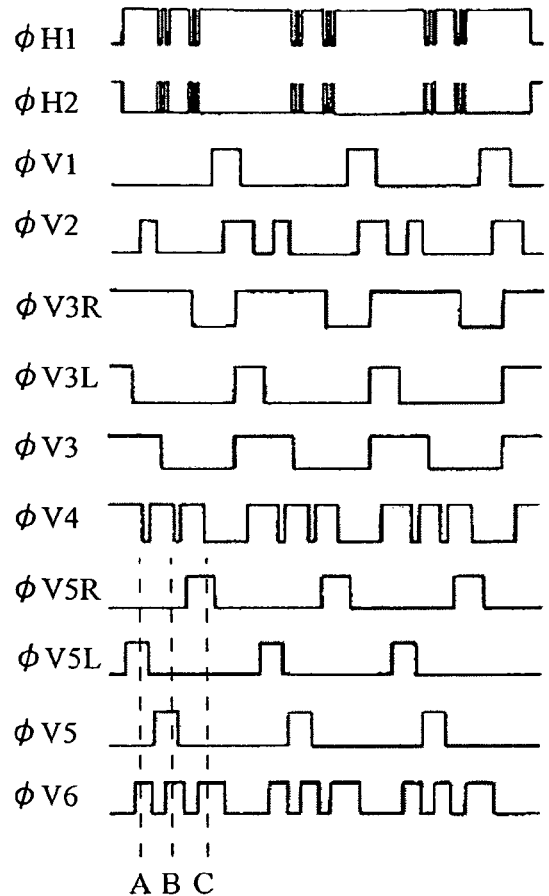
FIG. 2 is a timing chart of the first embodiment.

Next, in FIG. 2, a timing chart of the driving pulses for driving the solid-state image pickup device according to the first embodiment is shown.

In the solid-state image pickup device according to the first embodiment, when the driving pulses φV1 to φV6, φV3R, φV3L φV5R, and φV5L are at high level, the driving electrodes, to which the driving pulses are applied, serve as storage sections and when the driving pulses φV1 to φV6, φV3R, φV3L φV5R, and φV5L are at low level, the driving electrodes, to which the driving pulses are applied, serve as barrier sections.

First, at timing A in FIG. 2, in each three columns, the driving electrodes V5L and V6 serve as the storage sections and only a charge of the V5L line is transferred to the horizontal transfer section 10. When transferring the charge from the V5L line to the horizontal transfer section 10 is finished, by driving the driving electrodes H1 and H2 in the horizontal transfer section 10, the transferred charge is moved for two pixels in a forward direction (a direction toward an output amplifier).

Next, at timing B in FIG. 2, in each three columns, the driving electrodes V5 and V6 serve as the storage sections and only a charge of the V5 line is transferred to the horizontal transfer section 10. As a result, the charge of the V5L line, which has been transferred to the horizontal transfer section at timing A and the charge of the V5 line are mixed in the horizontal transfer section 10. By driving the driving electrodes H1 and H2 in the horizontal transfer section 10 after mixing the charges, the mixed charges are moved for two pixels in the forward direction.

Next, at timing C in FIG. 2, in each three columns, the driving electrodes V5R and V6 serve as the storage sections and only a charge of the V5R line is transferred to the horizontal transfer section 10. As a result, the mixed charges of the V5 and V5L lines are further mixed with the charge of the V5R line in the horizontal transfer section 10.

In other words, by performing driving operation through respectively applying driving pulses to the vertical transfer sections 40, the horizontal transfer section 10, and the distribution transfer section 20, the solid-state image pickup device according to the first embodiment is capable of mixing signal charges for three pixels neighboring in a horizontal direction.

Figure 3:
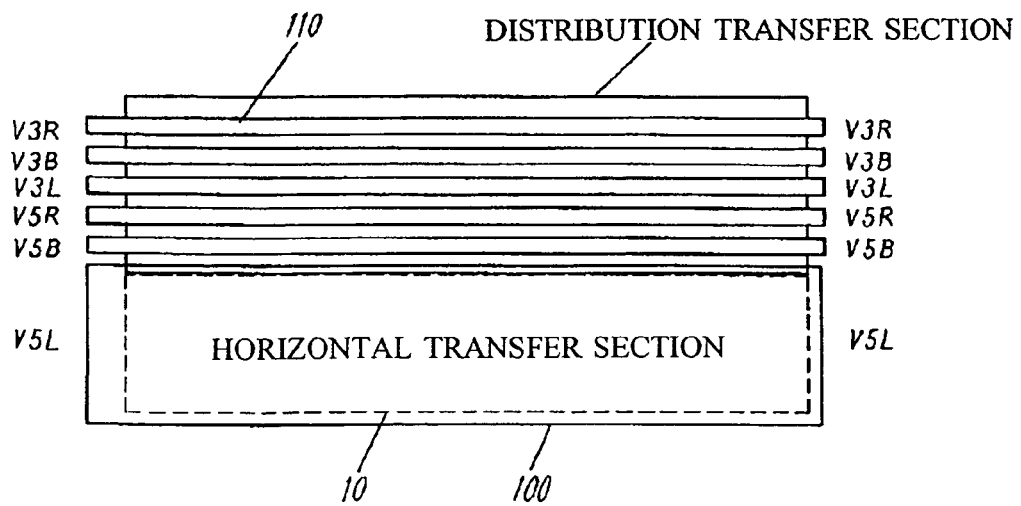
FIG. 3 is a schematic diagram illustrating wiring in the distribution transfer section of the first embodiment.

Next, FIG. 3 is a diagram illustrating a part of the distribution transfer section 20 and the horizontal transfer section 10 in the solid-state image pickup device according to the first embodiment and showing a wiring configuration.

As shown in FIG. 3, in the solid-state image pickup device according to the first embodiment, first wires 110 for applying the driving pulses to the driving electrodes V3, V3R, V3L, V5, and V5R are formed above the distribution transfer section 20 so as to extend in a horizontal transfer direction and only a first wire 100 is formed above the horizontal transfer section 10 so as to cover entirely the horizontal transfer section 10.

Further, the driving pulses φV3, φV3R, φV3L, φV5, and φV5R are supplied via the first wires 110 provided in a respectively independent manner to the driving electrodes V3, V3R, V3L, V5, and V5R provided in the distribution transfer section 20, which is provided in proximity to a connecting portion of the vertical transfer sections 40 and the horizontal transfer section 10 and controls, independently for each column, reading out the signal.

In other words, in the configuration of the solid-state image pickup device according to the first embodiment, the first wires 110 for supplying the driving pulses to the driving electrodes V3, V3R, V3L, V5, and V5R are all wired in a horizontal transfer direction in an image pickup region 30 to the distribution transfer section 20.

The first wire 100 for applying the driving pulses to the driving electrodes V5L is formed so as to cover entirely the horizontal transfer section 10. The first wire 100, which is used for wiring the driving electrodes V5L, is formed in a layer made of metal, such as aluminum, having a high light shielding characteristic.

In order to facilitate understanding the present invention in detail, description will be given by comparing the first embodiment and a conventional art.

Figure 9:
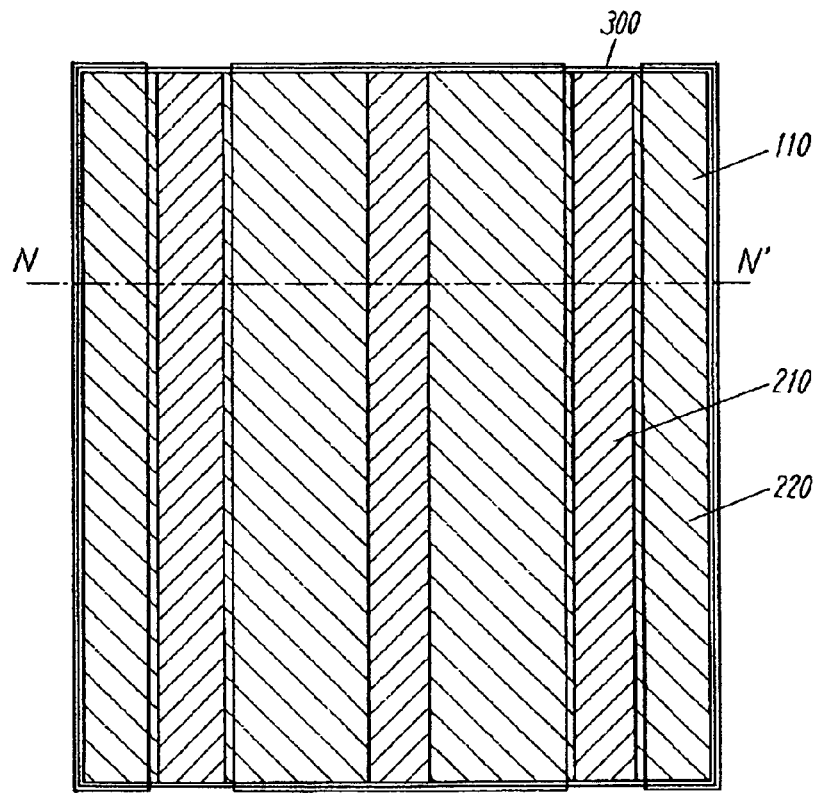
FIG. 9 is a diagram illustrating a detailed layout of wiring, made of aluminum, of a horizontal transfer section and polysilicon gate electrodes of the conventional art.
Figure 10:
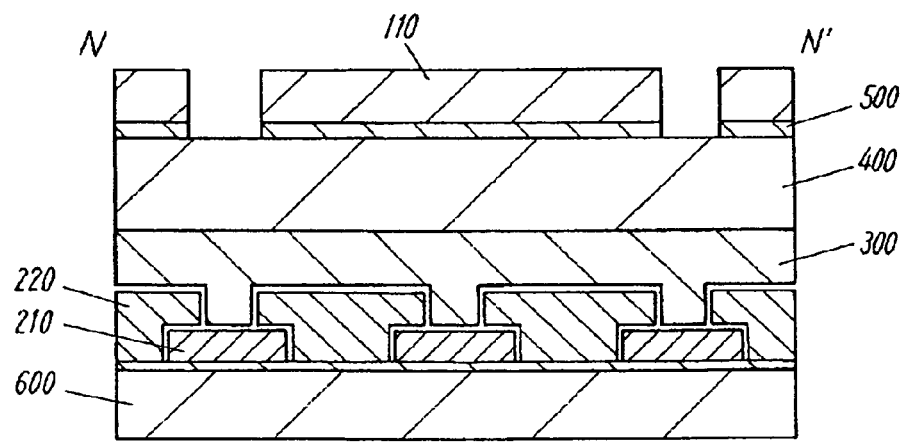
FIG. 10 is a diagram illustrating a cross-section view of the conventional horizontal transfer section.

FIG. 9 is a diagram illustrating a detailed wiring layout of a horizontal transfer section comprising polysilicon gate electrodes and an aluminum layer in a solid-state image pickup device of the conventional art. FIG. 10 is a diagram illustrating across-sectional view, along a line N-N' in FIG. 9, of the horizontal transfer section having a conventional configuration.

Figure 4:
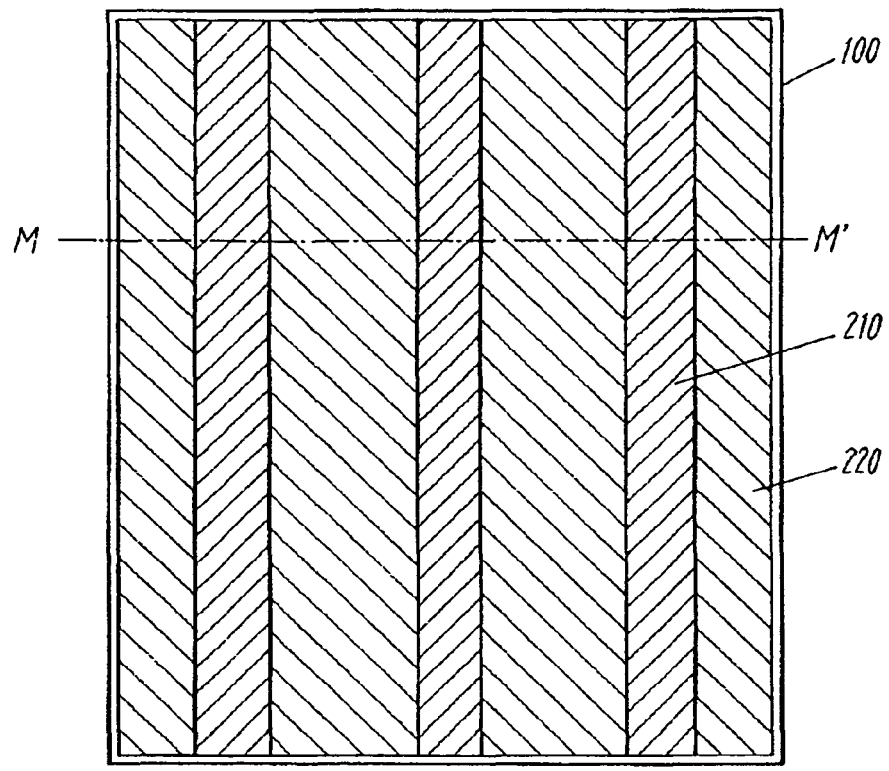
FIG. 4 is a diagram illustrating a detailed layout of wiring, made of aluminum, of a horizontal transfer section and polysilicon gate electrodes of the first embodiment.
Figure 5:
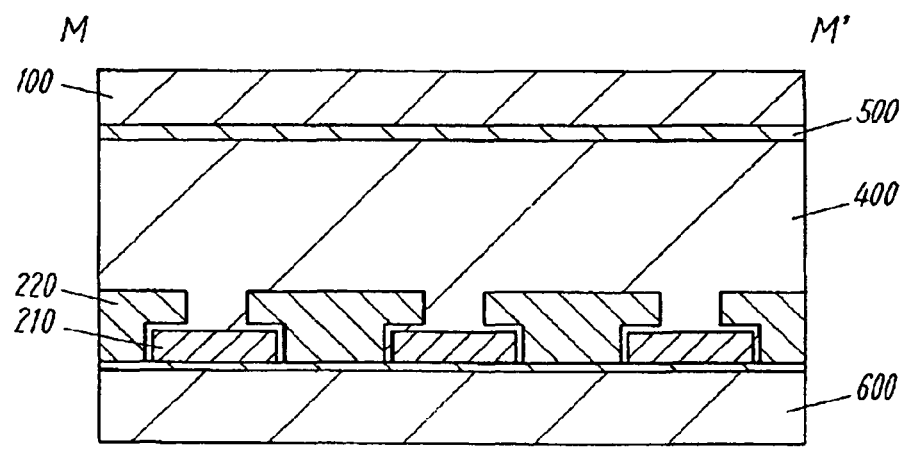
FIG. 5 is a diagram illustrating a cross-sectional view of the horizontal transfer section of the first embodiment.

On the other hand, FIG. 4 is a diagram illustrating a detailed wiring layout of the horizontal transfer section 10 comprising polysilicon gate electrodes 210 and 220 and aluminum layers 100 and 110 in the solid-state image pickup device according to the first embodiment. FIG. 5 is a diagram illustrating a cross-sectional view, along a line M-M' in FIG. 4, of the horizontal transfer section 10.

In FIGS. 9 and 10, the solid-state image pickup device of the conventional art comprises a silicon substrate 600, a plurality of polysilicon electrodes 210 and 220 formed on the silicon substrate, a first light shielding layer 300 formed so as to cover the polysilicon electrodes 210 and 220, an interlayer film 400 formed on the first light shielding layer 300, a barrier metal 500 formed on the interlayer film 400, and a first wire 110 formed on the barrier metal 500. As described above, in the conventional solid-state image pickup device, the horizontal transfer section 10 is light-shielded by the first light shielding layer 300 made of tungsten and the aluminum layer of the first wire 110.

As is clear in FIG. 9, however, since the aluminum layer of the first wire 110 is formed in a stripe manner, there accrues a part of the horizontal transfer section 10, which is light-shielded only by the tungsten layer of the first light shielding layer 300. Therefore, there maybe a case where a sufficient light shielding characteristic cannot be obtained in the part of the horizontal transfer section 10, which is light-shielded only by the tungsten layer.

Since above the horizontal transfer section 10, the tungsten layer of the first light shielding layer 300 and the horizontal transfer electrodes of the polysilicon gate electrodes 210 and 220 are in proximity to each other in a direction perpendicular to the substrate 600, a capacitance between the first light shielding layer 300 and the polysilicon gate electrode 210 or 220 may increase.

On the other hand, the solid-state image pickup device according to the first embodiment, as shown in FIGS. 4 and 5, comprises the silicon substrate 600, the plurality of polysilicon electrodes 210 and 220 formed on the silicon substrate 600, the inter layer film 400 formed so as to cover the polysilicon electrodes 210 and 220, the barrier metal 500 formed on the interlayer film 400, and the first wire 100 formed on the barrier metal 500. As described above, the solid-state image pickup device according to the first embodiment has a configuration in which the horizontal transfer section 10 is light-shielded by the aluminum layer.

In other words, since the horizontal transfer section 10 can be light-shielded by the layer made of metal, such as aluminum, having a high light shielding characteristic, the solid-state image pickup device according to the first embodiment is capable of attaining greater light shielding performance than that of the solid-state image pickup device of the conventional art.

Furthermore, in the solid-state image pickup device according to the first embodiment, the wiring for supplying the driving pulse to the driving electrode V5L is formed so as to cover entirely the horizontal transfer section 10, whereby a space required for one wire, which is connected to the distribution transfer section 20 in the horizontal transfer direction in the image pickup region 30 and supplies the driving pulse to the driving electrode, can be saved.

The other driving electrodes V3, V3R, V3L, V5, and V5R can be all wired in the horizontal transfer direction in the image pickup region 300.

Furthermore, in the solid-state image pickup device according to the first embodiment, as shown in FIG. 5, the horizontal transfer section 10 is light-shielded by the aluminum layer formed in an upper layer than a layer in which the tungsten layer is formed, whereby a capacitance between the polysilicon gate electrode and the light shielding layer can be reduced.

In other words, in the solid-state image pickup device according to the first embodiment, by reducing the capacitance between the polysilicon gate electrode 210 or 220 and the first wire 100 formed on in the aluminum layer, a time constant, which can be obtained from the capacitance and a resistance between the terminals in the horizontal transfer section 10, can be reduced, thereby reducing unsharpness of horizontal transfer driving pulses.

Furthermore, the capacitance between the terminals can be reduced, thereby allowing faster transfer in the horizontal transfer section 10 than that in the conventional art.

In addition, in the solid-state image pickup device according to the first embodiment, since the light shielding layer of the aluminum layer used for light-shielding the horizontal transfer section 10 is used as the wire for the driving electrode V5L in the distribution transfer section 20, wiring for a driving electrode can be formed even above miniaturized cells.

Furthermore, in the conventional art, the driving pulse to be supplied to the driving electrode V5L is applied to the wiring formed in the horizontal transfer section. Therefore, it is concerned that coupling may arise between the driving electrodes H1 and H2 of the horizontal transfer section and the wire connected to the driving electrode V5L and the pulse applied to the driving electrode V5L may exert an influence on the horizontal driving pulse, leading to a failure in horizontal transfer. On the contrary, in the solid-state image pickup device of the present invention, as shown in FIG. 2, a period in which the driving pulse is applied to the aluminum layer (the first wire 100) functioning as a light-shielding layer is included in a horizontal blanking period (a period in which the horizontal transfer section remains still). Therefore, a failure in horizontal transfer which is caused by applying the driving pulse to the light shielding layer of the horizontal transfer section 10 does not arise.

Furthermore, in the conventional solid-state image pickup device, the tungsten layer used for the image pickup region is used for light-shielding the horizontal transfer section 10. In the solid-state image pickup device of the present invention, however, a part of the aluminum layer functions as both the wire for the driving electrode V5L and the light shielding film. Thus, it is not required to newly form a layer for wiring and light-shielding.

Although in the solid-state image pickup device according to the first embodiment, the horizontal transfer section 10 is light-shielded by the first wire 100 of the aluminum layer, in another embodiment of the present invention, the horizontal transfer section 10 may be light-shielded by forming two aluminum layers, above the horizontal transfer section 10, including a first and a second light shielding layers and by using the second light shielding layer in addition to the first light shielding layer which functions as both the first wire and the light shielding film. In a case where the first and the second light shielding layers made of aluminum are formed above the horizontal transfer section 10, the wires connected to the driving electrodes V3, V3R, V3L, V5, V5R, and V5L may be divided into two groups: first wires formed in the first light shielding layer and second wires formed in the second light shielding layer.

Although in the solid-state image pickup device according to the first embodiment, the first wires 110 formed in the aluminum layer are connected to the driving electrodes V3, V3R, V3L, V5, and V5L, in another embodiment of the present invention, an aluminum layer having a two-layer-structure may be formed above the distribution transfer section 20 and the wires connected to the driving electrodes V3, V3R, V3L, V5, and V5L may be divided into two groups: first wires formed on a first aluminum layer and second wires formed on a second aluminum layer.

In the solid-state image pickup device of the present invention, an on-chip lens layer may be formed above the horizontal transfer section 10 and a black on-chip lens layer may be formed above the distribution transfer section 20.

In the solid-state image pickup device of the present invention, as the black on-chip lens layer, a lens layer in which layers of a plurality of colors, for example, colors R and B, are laminated may be formed.

The on-chip lens layer may be formed, for example, in a process of forming color filters above the photo-detecting sections 50. Thus, without adding any new manufacturing process, entering of light into the transfer section can be prevented, allowing easy prevention of deterioration in image quality.

Although an example of the solid-state image pickup device according to the first embodiment, in which a common pattern of electrodes is repeated for each 2n+1 columns, is described, another embodiment of the present invention is applicable to a solid-state image pickup device in which a common pattern of electrodes is repeated for each 2n (n is an integer equal to or greater than 1) columns.

Although in the example of the first embodiment, as the color filters, the filters of three colors are described, in another embodiment of the present invention, filters of four colors such as cyan, magenta, yellow, and green may be used.

Although in the solid-state image pickup device according to the first embodiment, the driving electrodes V3, V3R, V3L, V5, and V5L are wired from both sides of the horizontal transfer direction in the image pickup region, in another embodiment of the present invention, the driving electrodes V3, V3R, V3L, V5, and V5L may be wired from one side of the horizontal transfer direction in the image pickup region Second Embodiment Next, with reference to figures, a camera, including the solid-state image pickup device, according to a second embodiment of the present invention will be described.

Figure 6:
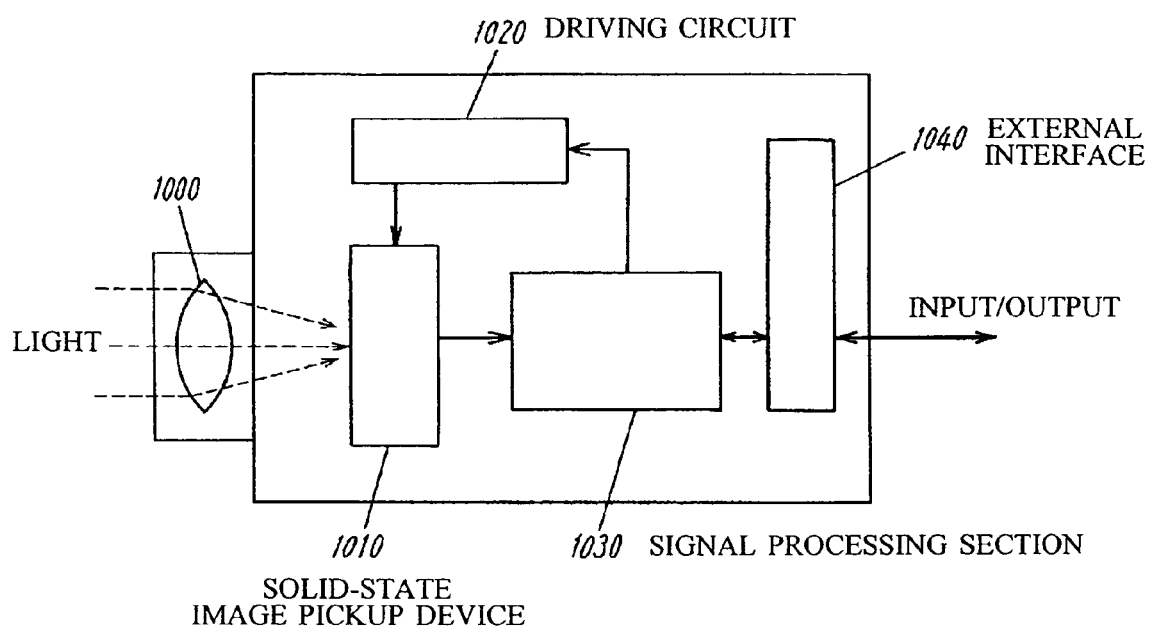
FIG. 6 is a block diagram illustrating a camera according to a second embodiment of the present invention.
Figure 7A:
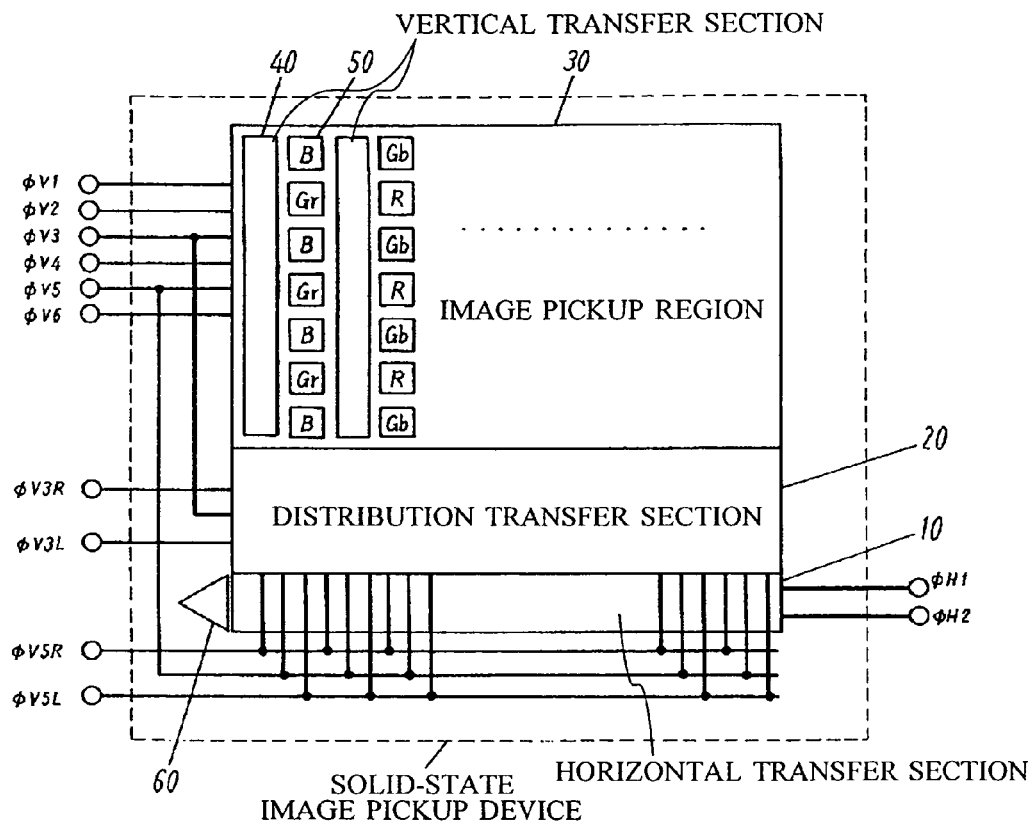
FIG. 7A is a schematic configuration diagram illustrating a conventional solid-state image pickup device.
Figure 7B:
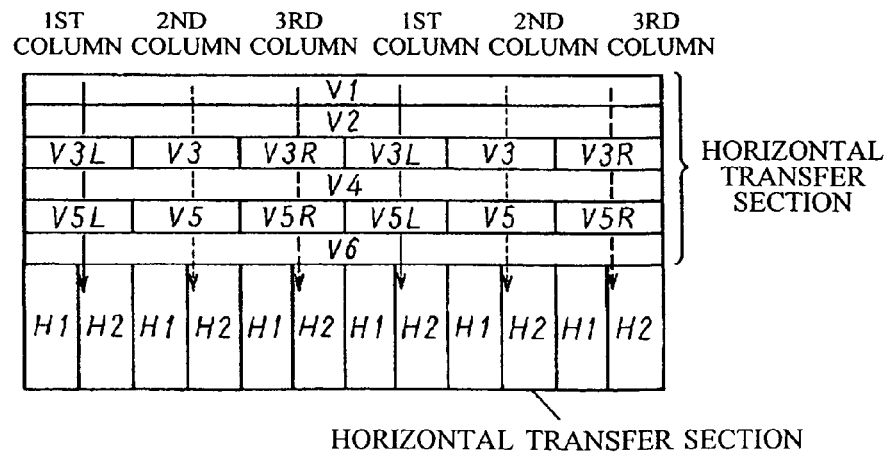
FIG. 7B is a configuration diagram illustrating a gate of the conventional distribution transfer section.
Figure 8:
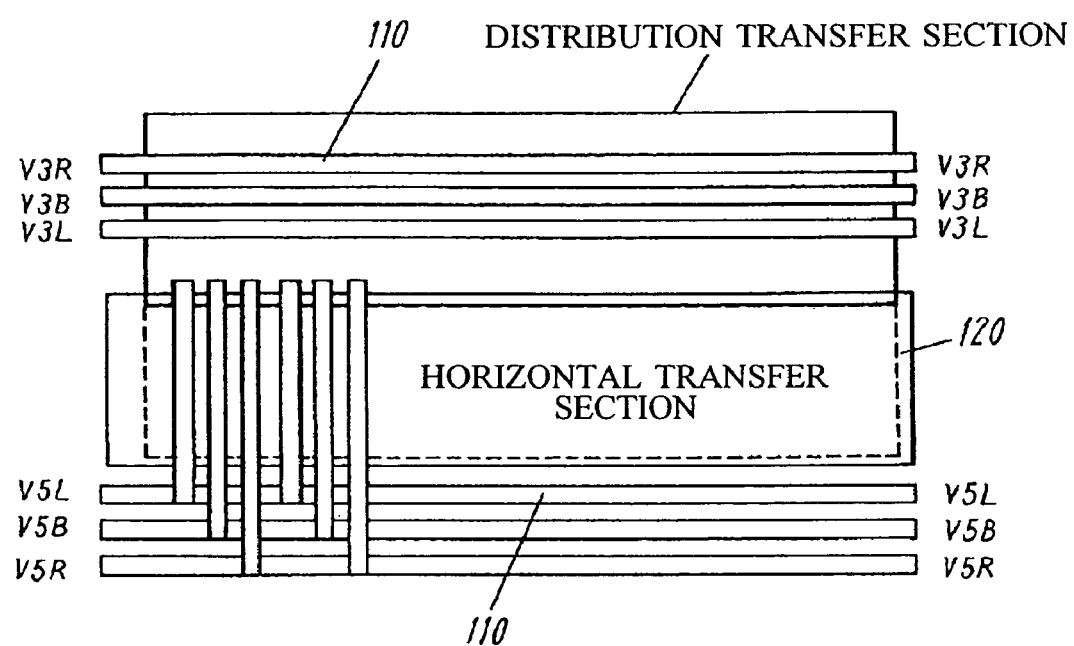
FIG. 8 is a schematic diagram illustrating wiring in the conventional distribution transfer section.

FIG. 6 is a block diagram illustrating the camera, including the solid-state image pickup device, according to the second embodiment.

In FIG. 6, the camera according to the second embodiment comprises a lens 1000, the solid-state image pickup device 1010 according to the above-described first embodiment, a driving circuit 1020, a signal processing section 1030, an external interface 1040.

In the camera, light which passes through the lens 1000 enters the solid-state image pickup device 1010. The signal processing section 1030 controls the driving circuit 1020 to drive the solid-state image pickup device 1010, loads output signals from the solid-state image pickup device 1010, and performs various processes on the loaded output signals. The signals processed by the signal processing section 1030 are outputted via the external interface 1040 externally.

The camera, having the above-mentioned configuration, according to the second embodiment is capable of outputting data from the solid-state image pickup device 1010 at high speed.

Since the solid-state image pickup device 1010 is excellent in light shielding performance, failures such as smear in a horizontal direction, caused when light passes through a light shielding layer, and clamping mistake caused when a smear component enters a vacant transfer section can be prevented.

Therefore, the camera according to the second embodiment is capable of shooting images having fine quality without causing failures such as clamping mistake particularly when shooting a high-brightness object.

The solid-state image pickup device of the present invention is useful when a high frame rate is required. In particular, the solid-state image pickup device is useful for a digital still camera or the like in which high resolution and a high frame rate in shooting a moving image are required.

While the invention has been described in detail, the foregoing description is in all aspects illustrative and not restrictive. It is understood that numerous other modifications and variations can be devised without departing from the scope of the invention.

What is claimed is:

1. A solid-state image pickup device comprising:
   a plurality of photo-detecting sections for generating signal charges;
   a plurality of vertical transfer sections for transferring the signal charges in a vertical direction;
   a horizontal transfer section for receiving the signal charges from the vertical transfer sections and transferring the received signal charges in a horizontal direction;
   a distribution transfer section including a plurality of driving electrodes which are independently provided in a column direction in order to transfer the signal charges from the vertical transfer sections to the horizontal transfer section;
   a first wire, which is formed on the horizontal transfer section and connected to the driving electrodes, for light-shielding the horizontal transfer section, and
   a colored on-chip lens layer which is formed in at least one of the region above the distribution transfer section and the region above the horizontal transfer section.

2. The solid-state image pickup device according to claim 1, wherein the horizontal transfer section is light-shielded only by the first wire.

3. The solid-state image pickup device according to claim 2, wherein the first wire is formed in an aluminum layer.

4. The solid-state image pickup device according to claim 1, further comprising a second light shielding layer formed above the horizontal transfer section.

5. The solid-state image pickup device according to claim 2, further comprising a second light shielding layer formed above the distribution transfer section.

6. The solid-state image pickup device according to claim 1, further comprising a second wire formed above the horizontal transfer section.

7. The solid-state image pickup device according to claim 6, wherein the second wire is formed in the second light shielding layer which is an aluminum layer.

8. The solid-state image pickup device according to claim 1, wherein the distribution transfer section has a common pattern of electrodes for each n (n is an integer equal to or greater than 2) columns.

9. The solid-state image pickup device according to claim 1, wherein the colored on-chip lens layer is a black on-chip lens layer.

10. A camera including a solid-state image pickup device, wherein
    the solid-state image pickup device comprises:
    a plurality of photo-detecting sections for generating signal charges;
    a plurality of vertical transfer sections for transferring the signal charges in a vertical direction;
    a horizontal transfer section for receiving the signal charges from the vertical transfer sections and transferring the received signal charges in a horizontal direction;
    a distribution transfer section including a plurality of driving electrodes which are independently provided in a column direction in order to transfer the signal charges from the vertical transfer sections to the horizontal transfer section;
    a first wire, which is formed on the horizontal transfer section and connected to the driving electrodes, for light-shielding the horizontal transfer section, and
    a colored on-chip lens layer which is formed in at least one of the region above the distribution transfer section and the region above the horizontal transfer section.

* * * * *